(12) United States Patent
Suzuki et al.

(10) Patent No.: US 8,013,669 B2
(45) Date of Patent: Sep. 6, 2011

(54) DYNAMIC POWER NOISE EVENT COUNTER

(75) Inventors: Shingo Suzuki, San Jose, CA (US); Toshinari Takayanagi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 2 days.

(21) Appl. No.: 12/606,534

(22) Filed: Oct. 27, 2009

(65) Prior Publication Data

US 2011/0096891 A1 Apr. 28, 2011

(51) Int. Cl.
*G05F 1/10* (2006.01)

(52) U.S. Cl. .......................... 327/544; 713/340

(58) Field of Classification Search .................. 327/143
See application file for complete search history.

(56) References Cited

U.S. PATENT DOCUMENTS

| | | | |
|---|---|---|---|
| 5,850,514 A * | 12/1998 | Gonda et al. ..................... | 714/55 |
| 6,806,729 B2 * | 10/2004 | Wallace et al. .................. | 326/33 |
| 7,093,167 B2 * | 8/2006 | Komiya ........................... | 714/44 |
| 7,218,135 B2 | 5/2007 | Arsovski | |
| 7,301,320 B2 * | 11/2007 | Dreps et al. .................... | 323/299 |
| 7,355,429 B2 * | 4/2008 | Jenkins et al. .............. | 324/750.3 |
| 7,359,811 B1 | 4/2008 | Liu | |
| 7,467,050 B2 * | 12/2008 | Douriet et al. .................. | 702/64 |
| 7,564,274 B2 * | 7/2009 | Hughes .......................... | 327/108 |
| 7,636,288 B2 | 12/2009 | Ueki | |
| 7,733,164 B2 * | 6/2010 | Umamichi et al. ........... | 327/551 |
| 7,734,433 B2 * | 6/2010 | Konmoto ........................ | 702/64 |
| 7,818,599 B2 * | 10/2010 | Haridass et al. .............. | 713/340 |
| 2003/0226082 A1 * | 12/2003 | Kim et al. ...................... | 714/734 |
| 2004/0183613 A1 * | 9/2004 | Kurd et al. ..................... | 331/186 |
| 2008/0218195 A1 * | 9/2008 | Kajita ............................. | 324/771 |
| 2008/0258751 A1 * | 10/2008 | Jenkins et al. ................. | 324/763 |
| 2008/0283876 A1 * | 11/2008 | Souda ............................ | 257/254 |
| 2009/0034144 A1 * | 2/2009 | Dreps et al. ................... | 361/118 |
| 2009/0048794 A1 * | 2/2009 | Douriet et al. ................. | 702/64 |
| 2009/0063884 A1 * | 3/2009 | Weekly .......................... | 713/340 |
| 2010/0039099 A1 * | 2/2010 | Kim et al. ...................... | 324/120 |

* cited by examiner

*Primary Examiner* — Thomas J Hiltunen
(74) *Attorney, Agent, or Firm* — Lawrence J. Merkel; Meyertons, Hood, Kivlin, Kowert & Goetzel, P.C.; Erik A. Heter (57) ABSTRACT

An apparatus and method for detecting noise in a power supply voltage. A circuit may include a voltage generation unit coupled to receive a power supply voltage, and a detection unit. The voltage generation unit may generate first and second voltages using the power supply voltage, and may vary the relationship therebetween responsive to fluctuations in the power supply voltage. A detection unit may detect the variations in the relationship between the first and second voltages that result from fluctuations in the power supply voltage. Responsive to detecting the variations, the detection unit may generate pulses to be provided to a counter. The counter may update a count value responsive to receiving pulses.

24 Claims, 10 Drawing Sheets

DYNAMIC POWER NOISE EVENT COUNTER

BACKGROUND

1. Field of the Invention

This invention relates to electronic circuits, and more particularly, to circuits configured to monitor power supply noise.

2. Description of the Related Art

The stability of a power supply voltage is essential for the proper operation of many electronic systems. An unstable power supply voltage can cause erroneous operation that may lead to unrecoverable errors. Due to the importance of power supply stability, many integrated circuits (IC's) include power monitoring circuits configured to detect power supply noise.

Various types of detection circuits may be implemented in order to detect power supply noise. Once such type of circuit is a ring oscillator. Some ring oscillators may vary the frequency of a respective output signal responsive to a spike (i.e. increase) in the power supply voltage. Ring oscillators may also be designed to vary the frequency of a respective output signal responsive to a droop (i.e. decrease) in the power supply voltage. In either case, the variation in the output frequency may be measured by detecting jitter in the output signal.

Another type of noise detector circuit may utilize a comparator to compare the power supply voltage to a reference voltage. If the reference voltage can be controlled to a sufficient degree of precision, power supply noise may be detected and indicated by the comparator.

SUMMARY

Various embodiments of a circuit and method for power supply noise detection are disclosed. In one embodiment, a power monitoring circuit for detecting power supply noise may include a voltage generation unit and a detection unit. The voltage generation unit may be coupled to receive a power supply voltage, and may generate first and second voltages based on the power supply voltage. When the power supply voltage is stable, the first and second voltages may be different. Responsive to an occurrence of a power supply voltage fluctuation, at least one of the first and second voltages may vary. The detection unit may detect the variation in the relationship between the first and second voltages, and may generate a pulse responsive thereto. Responsive to one or more pulses, a count value provided by counter of the detection may be updated.

In one embodiment, a voltage generation unit may include first and second level shifters. The first and second level shifters may generate the first and second voltages, respectively, based on the received power supply voltage. A filter or other type of loading circuit may be coupled to an output of the second level shifter. In one embodiment, a filter may be implemented by coupling a capacitor between ground and the output of the second level shifter. The difference between the first and second voltages may be referred to as an offset voltage, and may be greater than zero in some embodiments, and less than zero in other embodiments.

A detection unit in one embodiment may include a differential amplifier coupled to receive the first and second voltages from the voltage generation unit. The differential amplifier may be coupled in a comparator configuration, and may generate pulses responsive to changes in the relationship between the first and second voltages. In one embodiment in which the offset voltage is greater than zero, the differential amplifier may generate a pulse when the different between the first and second voltages falls below zero. In another embodiment in which the offset voltage is less than zero, the differential amplifier may generate a pulse when the difference between the first and second voltages rises above zero.

Pulses generated by the differential amplifier may cause a counter of the detection unit to update its count value. In one embodiment, pulses generated by the differential amplifier may be received directly by a counter, or may pass through one or more pulse shaping circuits (e.g., inverters) before being received by the counter. In such embodiments, the count value may be updated by the counter responsive to each generated pulse. In other embodiments, a divider (e.g., a divide-by-two circuit) may provide one pulse to the counter for every N (e.g., N=2) pulses generated by the differential amplifier. Accordingly, in such embodiments, the count value is not updated with every pulse, but nevertheless provides information indicating the occurrence of noise events. Furthermore, utilizing a divider (e.g., the previously mentioned divide-by-two circuit) may pulse shape the waveform output by the differential amplifier (e.g., by giving an odd-shaped pulse a 50% duty cycle).

An integrated circuit (IC) may include a number of noise monitoring circuits according to the various embodiments described herein. Each of the noise monitoring units may be coupled to provide its respective count value to a power monitoring unit. The power monitoring unit may, based on the received count values, generate a power noise map indicating portions of the IC which are generating/experiencing power supply noise. The power monitoring unit may also perform various power control functions based on the received count values (e.g., adjusting the rush current of a power gating switch, altering the power supply voltage received by a particular block of circuitry, etc.).

Various embodiments described herein may be implemented without the use of a reference voltage, and without utilizing a ring oscillator. Accordingly, such embodiments may be implemented in a small area, and may detect short noise bursts (e.g., <10 ns) without the need to detect jitter.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits to implement the operation. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Figure 1:
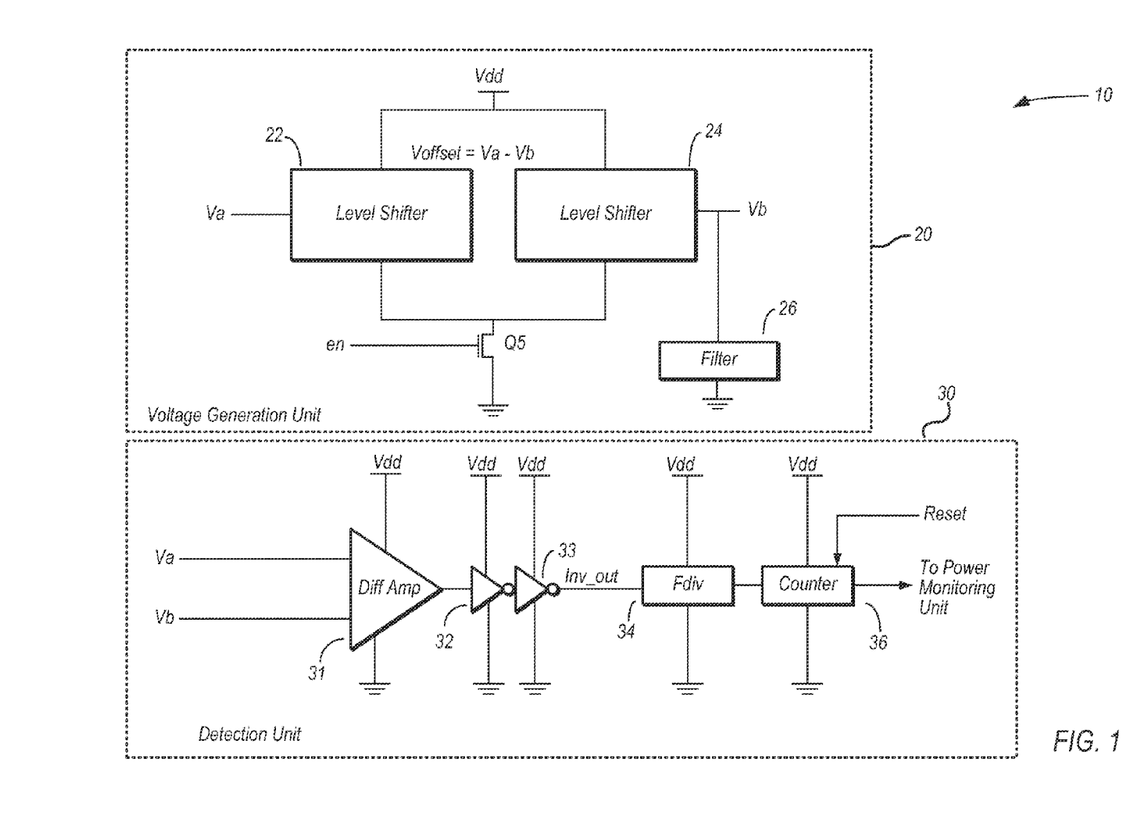
FIG. 1 is diagram illustrating one embodiment of a noise monitoring unit.

Turning now to FIG. 1, a diagram illustrating one embodiment of a noise monitoring unit 10 is shown. In the embodiment shown, noise monitoring unit 10 includes voltage generation unit 20 and detection unit 30. Voltage generation unit 10 is configured to generate two voltages, Va and Vb, which may be provided to detection unit 30. The relationship between voltages Va and Vb may vary responsive to power supply voltage noise event, i.e. variations in supply voltage Vdd. Detection unit 30 may generate pulses responsive to variations between voltages Va and Vb, and may also update a count value responsive to the generation of pulses.

In the embodiment shown, voltage generation unit 20 includes a first level shifter 22 and a second level shifter 24, both of which are coupled to receive a supply voltage Vdd. The level shifters 22 and 24 are configured to generate first and second voltages Va and Vb, respectively based on the level of supply voltage Vdd. When supply voltage Vdd is stable (i.e. in the absence of noise on the supply voltage node), the voltages Va and Vb may be different from each other. This difference between Va and Vb may be referred to as the offset voltage. As will be discussed below, at least one transistor in level shifter 22 may have a channel width/length ratio that is different than that of its counterpart in level shifter 24. This may contribute to a difference in voltages Va and Vb. In addition, the output node of level shifter 24 in the embodiment shown is coupled to a filter 26. Filter 26 may provide loading on the output node of level shifter 24, and may thus slow down or delay changes in Vb that may occur responsive to changes in supply voltage Vdd.

Voltage generation unit 20 may also include an enable input, which is coupled to a gate terminal of transistor Q5. In this embodiment, voltage generation unit 20 may be enabled with signal 'en' is high, and disabled when signal 'en' is low. When voltage generation unit 20 is disabled, substantially no current flow occurs through the level shifters 22 and 24, thereby saving power in times that supply voltage noise monitoring is not active. The enable/disable function is optional, and may not be implemented in other embodiments.

Detection unit 30 in the embodiment shown is coupled to receive voltages Va and Vb from voltage generation unit 20. More particularly, detection unit 30 includes a differential amplifier 31 that is coupled to receive Va on a first input and Vb on a second input. Differential amplifier 31 is coupled in a comparator configuration in the embodiment shown, and thus its output may swing full-rail between Vdd and ground. In the embodiment shown, differential amplifier 31 may output as signal at a voltage of approximately Vdd when voltage Va falls below that of Vb. Otherwise, the signal output by differential amplifier 31 may be at approximately a ground voltage when Va is greater than Vb.

Pulses may be asserted by differential amplifier 31 responsive to occurrences of noise in the supply voltage Vdd. For example, one embodiment of a detector 30 may be configured to cause differential amplifier 31 to output a positive-going pulse whenever supply voltage Vdd experiences a droop (e.g., a significant, rapid drop). The droop in the supply voltage Vdd may cause voltage Va, normally greater than voltage Vb in such an embodiment, to fall below voltage Vb. This may in turn cause differential amplifier 31 to output the positive going pulse.

In another embodiment, differential amplifier 31 may output a negative-going pulse whenever Vdd experiences a spike (e.g., a significant, rapid increase). In this embodiment, voltage Va may normally be less than voltage Vb. The spike in the supply voltage Vdd may in turn cause Va to rise rapidly to exceed voltage Vb, which may then result in differential amplifier 31 outputting the negative-going pulse.

In some embodiments, detection unit 30 may include pulse shaping circuits coupled to the output of differential amplifier 31. In this particular embodiment, inverters 32 and 33 are coupled in series, with the input of inverter 32 coupled to the output of differential amplifier 31. It should be noted however, inverters 32 and 33 are optional, and thus embodiments without these inverters are possible and contemplated.

A frequency divider 34 is coupled to the output of inverter 33 in this embodiment, while a counter 36 is coupled to the output of frequency divider 34. Counter 36 may receive a pulse and increment the count value N times for every M pulses received by frequency divider 32. For example, an embodiment may be implemented wherein counter 36 increments the count value 1 time for every 2 pulses received by frequency divider 34 (e.g., M=1, N=2). The values of M and N may be any integer values, where N is greater than or equal to M. Thus, even if counter 36 does not increment each time a pulse is asserted by differential amplifier 31 (and thus received by divider 34), the count value output by counter 36 may still be indicative of the number of noise events detected by noise monitoring circuit 10. However, M and N may be considered to be equal in embodiments wherein counter 36 updates the count value each time a pulse is asserted by differential amplifier 31. Generally speaking, counter 36 may operate as a pulse detection unit, updating (e.g., incrementing) a count value at M times for every N pulses. Other embodiments may record the noise events in different fashions. For example, a bit vector may be filled with set bits to indicated noise events and clear bits that indicate a lack of noise events over time (or vice versa). In general, any mechanism for recording noise events may be used.

Counter 36 may provide the count value to other units within an integrated circuit (IC) in which noise monitoring unit 10 is implemented. Furthermore, counter 36 may include a reset input, which may be used to reset the count value if necessary or desirable.

Figure 2:
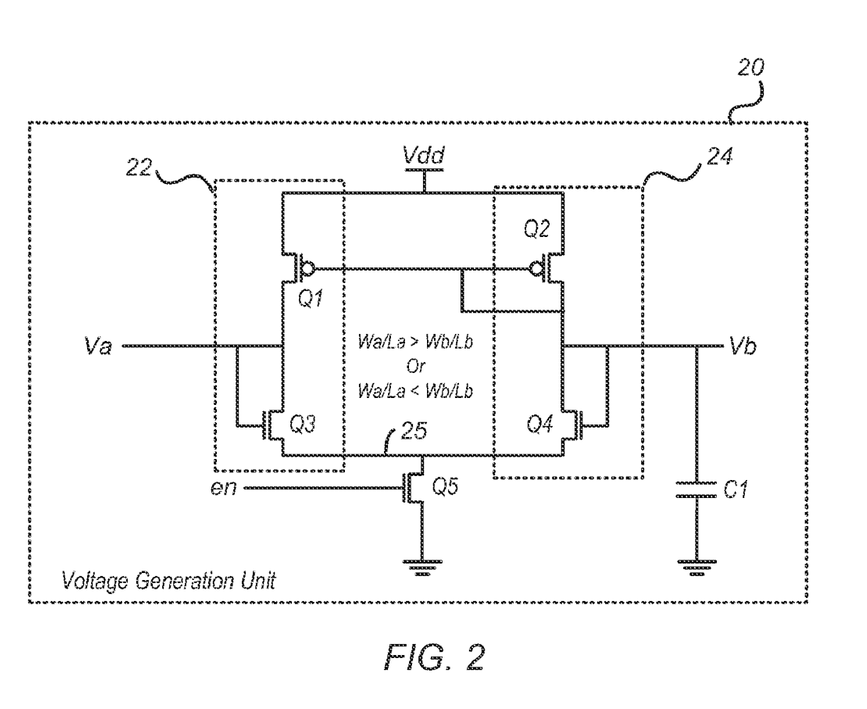
FIG. 2 is a schematic diagram of one embodiment of a voltage generating unit used in a noise monitoring unit.

FIG. 2 is a schematic diagram of one embodiment of a voltage generation unit 20. In the embodiment shown, first level shifter 22 of voltage generation unit 20 includes transistors Q1 and Q3. Second level shifter 24 includes transistors Q2 and Q4. A transistor Q5 is also coupled between a common node 25 and a ground node. A filter is also present in the form of a capacitor C1 in this embodiment, which is coupled to the output node upon which voltage Vb is conveyed.

Transistors Q1 and Q2 are PMOS (p-type metal oxide semiconductor) transistors in the embodiment shown, while transistors Q3, Q4, and Q5 are NMOS (n-type metal oxide semiconductor) transistors. In various embodiments of voltage generation unit 20, the channel width/length ratio of transistors Q1 and Q2 are different. In one embodiment, the channel width/length ratio of transistor Q1 (Wa/La) is greater than the channel width/length ratio of transistor Q2 (Wb/Lb). In another embodiment, Wa/La is less than Wb/Lb. In embodiments wherein Wa/La>Wb/Lb, transistor Q1 has a higher drive strength than transistor Q2. In contrast, the drive strength of transistor Q2 is greater than that of transistor Q1 in embodiments wherein Wa/La<Wb/Lb. The differences in the channel width/length ratios may cause the offset between voltages Va and Vb when the supply voltage Vdd is stable. That is, the transistor Q1 or Q2 with the higher drive strength may produce the higher voltage Va or Vb. The drive strength of Q1 and Q2 with respect to Q3 and Q4 may be selected such that Va and Vb are near Vdd/2 in operation, with the offset in place.

Some embodiments of voltage generation unit 20 may be configured to detect supply voltage droops, while other embodiments may be configured to detect supply voltage spikes. Embodiments are also possible and contemplated wherein both spikes and droops may be detected, although some of these embodiments may be droop-oriented or spike-oriented, depending on the size (e.g., capacitance) of the filter. In embodiments that are configured to detect supply voltage droops, or are droop oriented, the channel width length ratio Wa/La of transistor Q1 is greater than channel width/length ratio Wb/Lb of transistor Q2.

In embodiments that are configured to detect either droops or spikes in the supply voltage, the filter may be relatively large (e.g., may have a large capacitance), and thus voltage Vb may remain relatively stable despite any variations in the supply voltage or corresponding variations in Va. In embodiments that are droop and spike oriented, the filter may be relatively small (e.g., may have a small capacitance), and voltage Vb may vary some as well, although the variations of voltage Vb may be delayed and may be somewhat attenuated relative to the variations in voltage Va.

In the embodiment shown, voltage generation unit 20 includes a transistor Q5 having a drain terminal coupled to common node 25. Transistor Q5 may be activated by asserting a signal on the 'en' input, which in turn enables voltage generation unit 20.

Figure 3:
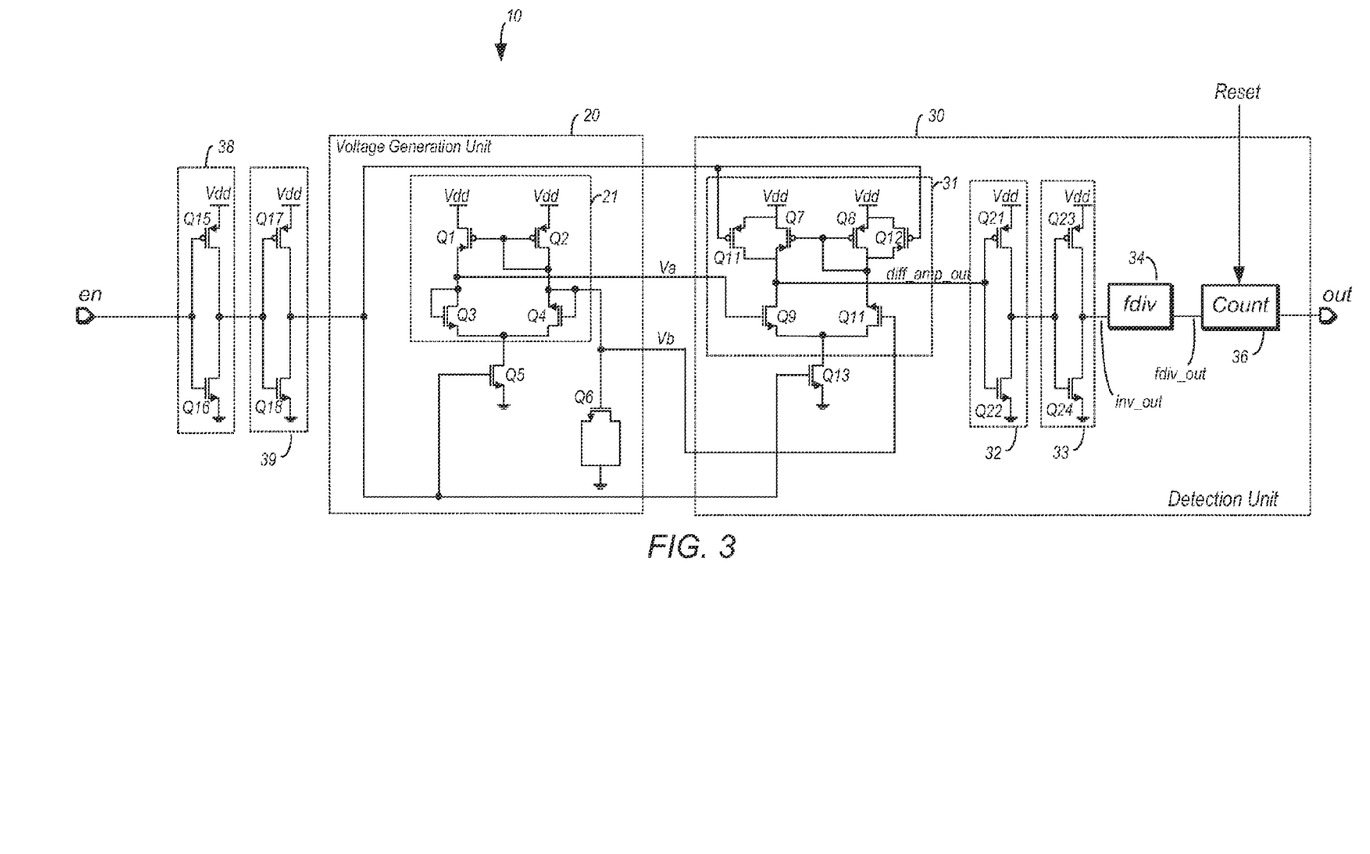
FIG. 3 is a schematic diagram of one embodiment of a noise monitoring unit.

FIG. 3 is a schematic diagram of another embodiment of noise monitoring unit 10. In the embodiment shown, voltage generation unit 20 of noise monitoring unit 10 includes a first differential amplifier circuit 21. The first differential amplifier circuit 21 includes transistors Q1-Q4, and may be enabled when Q5 is active. Detection unit 30 includes a second differential amplifier 31, which includes transistors Q7-Q10. The first differential amplifier circuit 21 may be configured, when enabled, to perform the voltage generation function as described above, generating voltages Va and Vb, and varying one or both of these voltages responsive to fluctuations in the supply voltage Vdd. In the embodiment shown, voltage generation unit 20 also includes transistor Q6, which is coupled to form a capacitor. Accordingly, the capacitor formed by Q6 may thus implement a filter on the output node upon which voltage Vb is conveyed. It should be noted however, the filters may be implemented using other circuit components as well, and the capacitively coupled Q6 is but one example.

The second differential amplifier circuit 31 may be configured, when enabled, act as a comparator circuit, comparing the voltages of Va and Vb and providing results of the comparison on the diff_amp_out node. In one embodiment, second differential amplifier 31 may provide a high output voltage (e.g., approximately equal to Vdd) on the diff_amp_out node when Va<Vb, and may otherwise provide a low output voltage on the diff_amp_out node. In some embodiments, differential amplifier 31 may assert a positive-going pulse to indicate a fluctuation in the supply voltage Vdd. In other embodiments, differential amplifier may assert a negative going pulse to indicate a fluctuation in the supply voltage Vdd.

As previously discussed, voltage generation unit 20 may be enabled or disabled according to the state of the 'en' signal input to the gate of transistor Q5. Detection unit 30 may also be enabled or disabled, depending on the states of transistors Q11-Q13. When the input 'en' signal is low, second differential amplifier 31 may be disabled, as transistors Q11 and Q12 may be active while transistor Q13 may be inactive. When transistor Q11 is active, the diff_comp_out node may be pulled up to Vdd, while the gate terminals of transistors Q7 and Q8 may be pulled to Vdd when transistor Q12 is active. Thus, when transistors Q11 and Q12, the source, gate, and drain terminals of both transistors Q7 and Q8 are all effectively at voltage Vdd, and thus fluctuations thereof do not result in pulses being asserted by differential amplifier 31. Furthermore, when transistor Q13 is inactive (due to the low 'en' signal), the differences in voltages Va and Vb may be ignored by differential amplifier 31.

In the embodiment shown, the 'en' signal may be pulse shaped by inverter 38 (which includes transistors Q15 and Q16), and inverter 39 (which includes transistors Q17 and Q18) before being input into voltage generation unit 20 and detection unit 30. It is noted however that these inverters are optional, and other embodiments may be implemented without their use.

FIGS. 4A-4D illustrate the operation of various embodiments of noise monitoring unit 10. The examples shown herein may be applicable to any of the previously discussed embodiments of FIGS. 1, 2, and 3. The example shown in FIG. 4A may be applicable to an embodiment wherein an offset voltage, V_offset (i.e. Va−Vb) is greater than zero. Using an embodiment of the circuit in FIG. 2 (or the differential amplifier 21 in FIG. 3), a positive offset voltage may be attained by sizing the transistors such that the channel width/length ratio of transistor Q1 is greater than that of transistor Q2 (i.e. Wa/La>Wb/Lb). The offset voltage may define a noise tolerance for noise monitoring unit, as fluctuations in supply voltage Vdd that are less than V_offset may be ignored by noise monitoring unit 10.

Figure 4A:
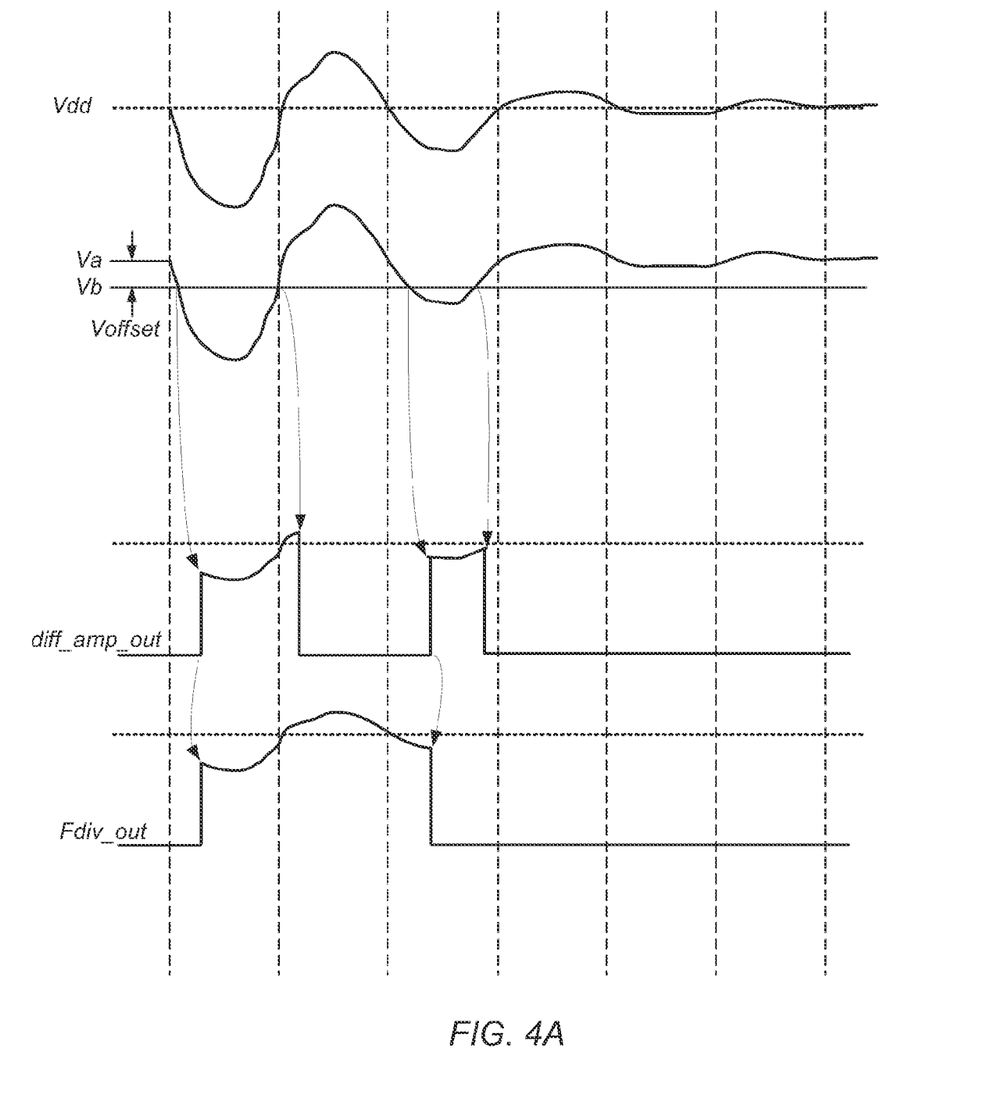
FIG. 4A is a timing diagram illustrating the operation of one embodiment of a noise monitoring unit.

The example of FIG. 4A is also applicable to an embodiment wherein a large filter (e.g., a capacitor with a relatively large capacitance value) is used. Thus, in an embodiment to which FIG. 4A is applicable, voltage Vb may remain relatively stable even when supply voltage noise causes variations in voltage Va. Furthermore, the example of FIG. 4A may be applied to an embodiment of noise monitoring unit 10 which is configured to detect voltage droops.

When Va is greater than Vb in the example of FIG. 4A, the output of the differential amplifier, diff_amp_out, is low when Va>Vb. When Vb falls below Va, diff_amp_out rises to the level of supply voltage Vdd. Since diff_amp_out is a full-rail signal, it may thus mirror somewhat the variations in supply voltage Vdd when Va<Vb. When Va rises back above Vb, diff_amp_out may fall back to ground.

The example shown in FIG. 4A also illustrates the output signal, Fdiv_out of frequency divider 34. More particularly, FIG. 4A illustrates an exemplary output when frequency divider 34 is configured to divide the frequency by two. Fdiv_out rises from ground to Vdd responsive to the first instance of Va falling below Vb in the example shown. However, Fdiv_out remains at Vdd in this example even after Va rises back above Vb. When Va falls below Vb a second time in the illustrated example, Fdiv_out also falls low. Thus, since frequency divider 34 is configured to divide by two in this example, Fdiv_out rises only once for every two instances of diff_amp_out rising. Furthermore, Fdiv_out rises on a first instance of diff_amp_out rising, and falls on the next instance of diff_amp_out rising.

Figure 4B:
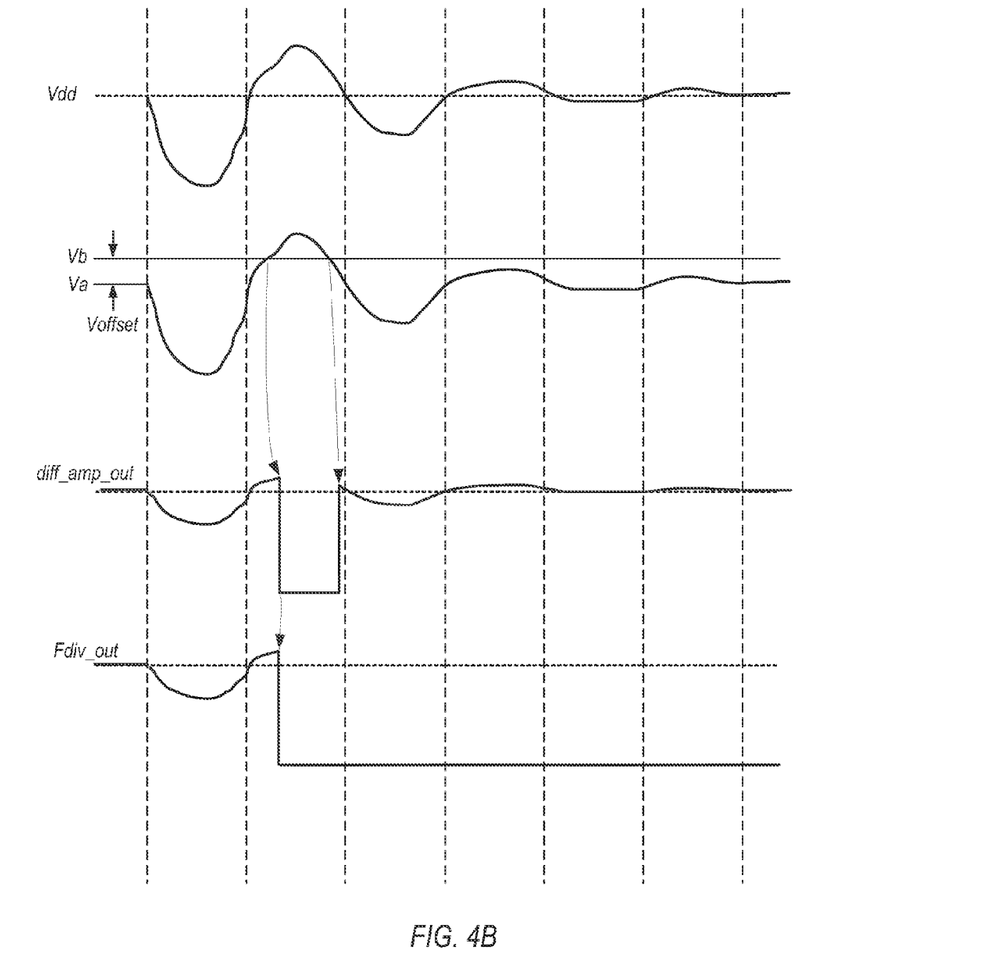
FIG. 4B is a timing diagram illustrating the operation of another embodiment of a noise monitoring unit.

Turning now to FIG. 4B, an example is shown wherein the offset voltage is negative (<0), or Va<Vb. An embodiment of noise monitoring unit 10 to which the example of FIG. 4B is applicable may be configured to detect spikes in supply voltage Vdd. Using one of the embodiments discussed above, a negative offset voltage may be attained by sizing the transistors Q1 and Q2 such that Wa/La<Wb/Lb. Similar to the example discussed in reference to FIG. 4A, an embodiment of noise monitoring unit 10 to which FIG. 4B is applicable may be implemented using a large filter, and thus voltage Vb may remain relatively stable during its operation.

In the example of FIG. 4B, diff_amp_out is initially high. Since this example applies to an embodiment which is configured to detect noise spikes, an initial noise droop may be ignored, since Va<Vb. However, when a noise event causes Va to rise above Vb, the differential amplifier may cause a negative-going pulse to be asserted.

This is shown in the example of FIG. 4B by diff_amp_out falling to ground responsive to Va rising above Vb. When Va falls below Vb again, diff_amp_out again rises to Vdd.

Fdiv_out also falls to ground responsive to Va rising above Vb in the example shown. However, when Va falls below Vb, Fdiv_out remains at ground. If the frequency divider is configured to divide by two, then Fdiv_out may again rise to Vdd responsive to the next instance of Va rising above Vb.

Figure 4C:
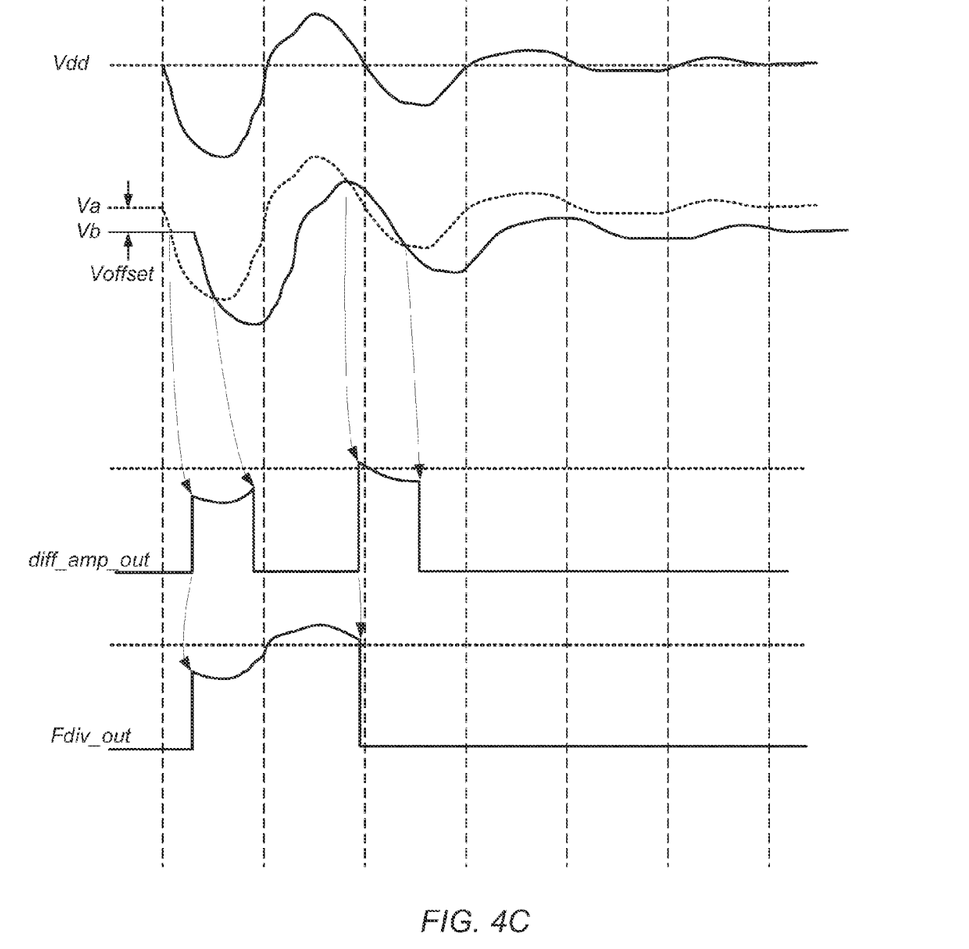
FIG. 4C is a timing diagram illustrating the operation of another embodiment of a noise monitoring unit.

The example shown in FIG. 4C is another example applicable to an embodiment having a positive offset voltage, wherein Wa/La>Wb/Lb. However, the example of FIG. 4C is also applicable to an embodiment to which the filter is small (e.g., relatively small capacitance). Accordingly, both Va and Vb may vary somewhat responsive to variations in supply voltage Vdd. The variations of Vb may be somewhat attenuated with respect to those of Va. Furthermore, due to the presence of the filter, the response of Vb to variations in Vdd may be delayed relative to the response of Va.

Since voltages Va and Vb may both vary responsive to fluctuations in supply voltage Vdd, the embodiment to which FIG. 4C is applicable may be considered to be droop oriented. That is, such an embodiment may be primarily configured to detect supply voltage droops, but may also detect some supply voltage spikes. In the example shown, a diff_amp_out may rise to Vdd responsive to Va falling below Vb. As Va falls, Vb also falls, although its fall is delayed relative to that of Va. Similarly, after Va begins rising again, Vb also begins to rise, after a delay. In this example, Va begins rising while Vb is still falling. When Vb falls enough that its value is less than that of Va, diff_amp_out again falls to ground in this example.

As Va continues to rise, responsive to the rise of Vdd above its nominal level, Vb also rises, until Va begins to fall again. However, since the response of Vb is delayed relative to Va, Vb is still rising when Va begins to fall. Accordingly, the falling Va passes the rising Vb, and once again Va is less than Vb, and thus diff_amp_out once again rises to Vdd. After Vb again falls below Va, diff_amp_out again falls to ground.

In the example shown, Fdiv_out rises to Vdd responsive to the first instance of diff_amp_out rising to Vdd, and falls to ground responsive to the second instance of diff_amp_out rising. Thus, the example of FIG. 4C is applicable to an embodiment that uses a divide-by-two divider.

Figure 4D:
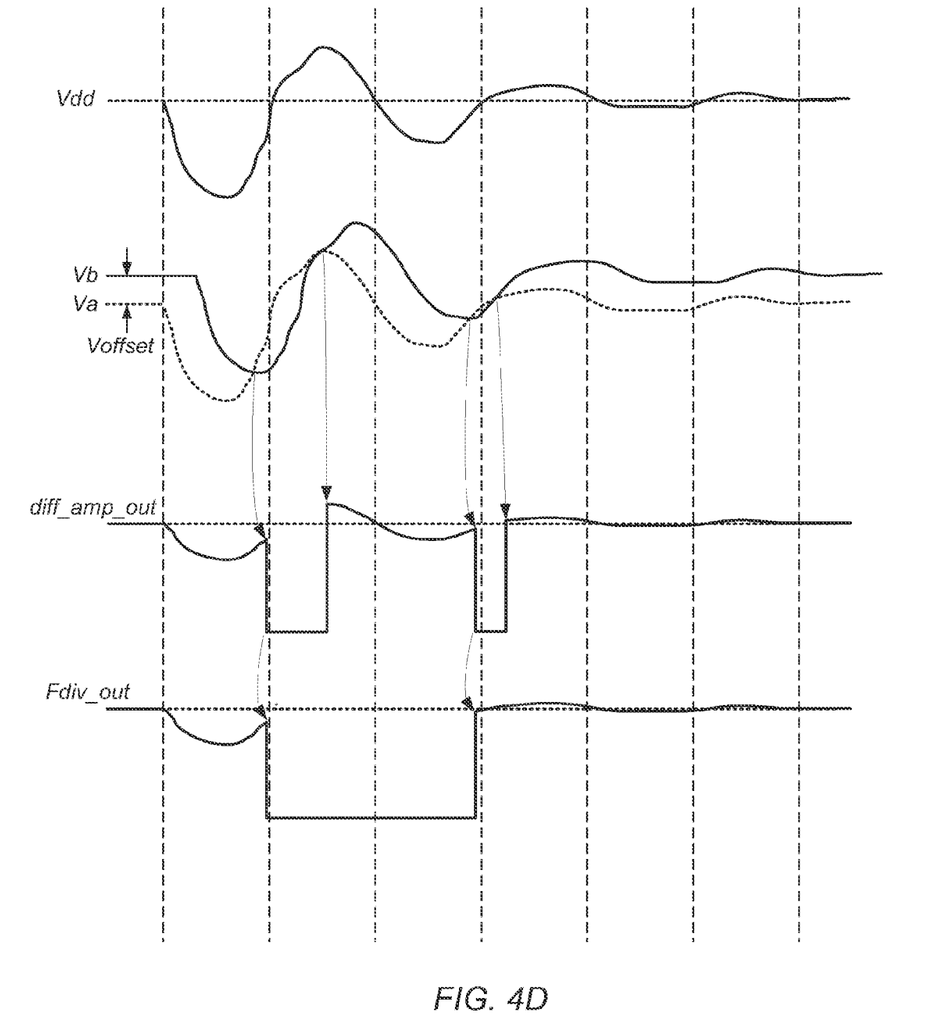
FIG. 4D is a timing diagram illustrating the operation of another embodiment of a noise monitoring unit.

Turning now to FIG. 4D, an example is shown that is applicable to an embodiment using a small filter and having a negative offset voltage. Transistors Q1 and Q2 of differential amplifier 21 may be sized such that Wa/La<Wb/Lb in order to achieve the negative offset voltage. The example thus may apply to an embodiment that is spike oriented (i.e. primarily configured to detect spikes in Vdd), but may also detect some voltage droops. As with the example of FIG. 4C, the response of Vb to variations in Vdd may be delayed relative to the response of Va.

In the example of FIG. 4D, Va begins falling responsive to a droop in Vdd. Voltage Vb also begins falling responsive to the droop in Vdd, although its fall is delayed relative to that of voltage Va. Since the falling of Vb is delayed relative to Va, Vb eventually falls below Va after Va begins rising again (responsive to Vdd rising). Responsive to Vb falling below Va, a negative going pulse is asserted by differential amplifier 31, and thus diff_amp_out falls to ground. Voltage Va follows Vdd, rising to a peak and then falling again. Voltage Vb also begins rising again after a delay. Eventually, the falling of Va coupled and the rising of Vb causes the former to fall below the latter, thereby resulting in diff_amp_out transitioning high.

Voltage Vb again falls low responsive to the falling of Vdd, and once again falls below Va. In response, diff_amp_out falls low again, but transitions high again once Vb rises above Va. Eventually, the variations of Vdd, Va, and Vb smooth out in the example shown, and Vb remains above Va, while diff_amp_out remains high.

As with the previous examples, the example of FIG. 4D also illustrates the operation of the divider 34 when configured to divide by two. Accordingly, Fdiv_out falls low responsive to the first instance of Vb falling below Va, and remains low even after Vb rises to a value greater than Va. Responsive to the second instance of Vb falling below Va, Fdiv_out rises to Vdd.

The examples presented above are presented for illustrative purposes, and are not intended to be limiting with respect to the capabilities of a given embodiment of the various circuits discussed above. Embodiments of the circuits above may be implemented using various offset voltages, as well as delay times in embodiments wherein the circuits are configured to droop or spike oriented. Furthermore, pulses asserted responsive to variations in the relationship between Va and Vb may be positive or negative going, depending on the particular embodiment.

Figure 5:
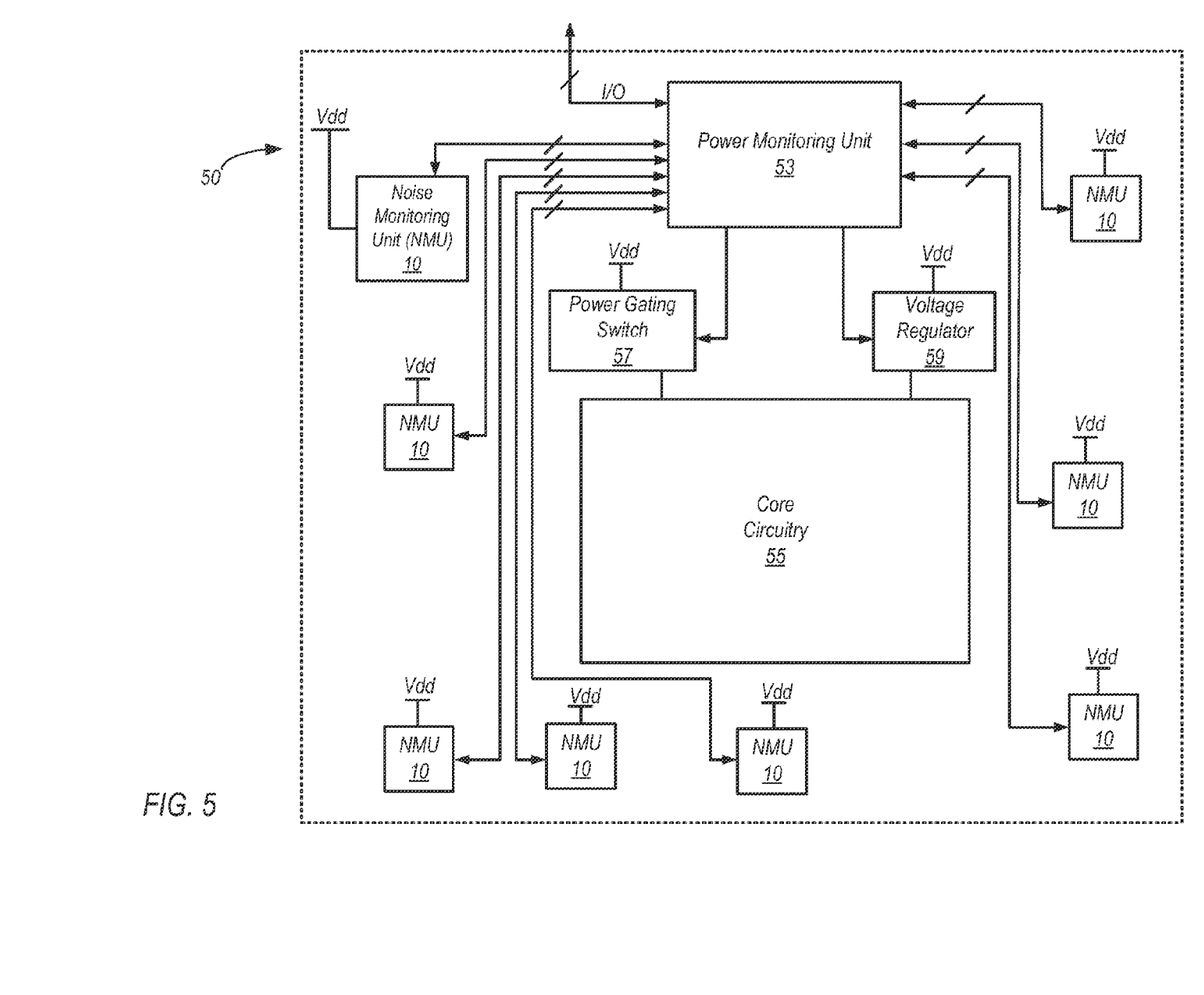
FIG. 5 is a block diagram of one embodiment of an integrated circuit having multiple noise monitoring units.

Turning now to FIG. 5, a block diagram of one embodiment of an integrated circuit (IC) having multiple noise monitoring units is shown. IC 50 in the embodiment shown include a power monitoring unit 53, a core circuitry unit 55, and a number of noise monitoring units 10. The noise monitoring units 10 may be any one of the embodiments discussed above. Furthermore, different embodiments of noise monitoring unit 10 may be implemented on IC 50. For example, some noise monitoring units 10 may be spike oriented, while others may be droop oriented. In another example, pairs of noise monitoring units 10 may be positioned close together in some embodiments of IC 50, where one noise monitoring unit 10 of the pair is configured to detect supply voltage droops, while the other noise monitoring unit 10 of the pair is configured to detect supply voltage spikes.

Each of the noise monitoring units 10 in the embodiment shown is coupled to power monitoring unit 53 by one or more signal lines. Each noise monitoring units 10 may provide a count value to power monitoring unit 53. Furthermore, each of the noise monitoring units 10 may receive a reset signal from power monitoring unit 53 in order to reset its respective counter 36. In some embodiments, the various instances of noise monitoring unit 10 may be reset independently of one another, while in other embodiments, each may be reset at approximately the same time. Power monitoring unit 53 may also be coupled to provide enable signals to the various instances of noise monitoring unit 10 distributed about IC 50. The various noise monitoring units 10 may be selectively enabled or disabled in some embodiments, while in other embodiments, noise monitoring units 10 may be enabled or disabled together. Each noise monitoring unit 10 may be enabled or disabled in accordance with the state of an enable signal (e.g., enabled when active, disabled when inactive) such as the 'en' signal discussed above with reference to FIGS. 1-3.

The physical distribution of the noise monitoring units 10 may enable power monitoring unit to generate a power noise map for the IC 50. As previously noted, each noise monitoring unit 10 is coupled to provide its respective count value to power monitoring unit 53 in the illustrated embodiment. These count values may be evaluated in both an absolute sense, as well as relative to each other. This in turn may provide information regarding the supply voltage noise level in its entirety for IC 50, but may also provide information with regard to the supply voltage noise level associated with particular areas. The information gathered by power monitoring unit 53 may be accessed through one or more I/O signal lines coupled thereto. The noise mapping information may be used to perform various power control functions associated with the operation of IC (examples of which will be given below). Furthermore, the noise mapping information may also be useful for determining design changes that may be made for future revisions of IC 50, as well as for the design of other similar IC's.

It is noted that, while the above embodiment outputs count values indicative of noise events from the noise monitoring units 10 to the power monitoring unit 53, other embodiments may signal noise events from the noise monitoring units 10 to the power monitoring unit 53, which may record the noise events in any desired fashion.

In the embodiment shown, IC 50 includes a core circuitry unit 55, which includes circuitry that performs the intended function of the device. Analog and/or digital circuits may be included within core circuitry 55. The circuitry of core circuitry unit 55 may be physically distributed within the device, and thus the representation shown in the FIG. 5 is exemplary. It should also be noted that instances of noise monitoring unit 10 may be also be placed within and among the various circuits that make up core circuitry unit 55.

IC 50 includes a power gating switch 57 in the embodiment shown. In some embodiments, core circuitry 55 may include a virtual supply voltage node, which may receive the supply voltage Vdd through power gating switch 57. Power gating switch 57 may be open or closed, depending on various factors, such as the workload of core circuitry 55, operational mode (e.g., a low power mode or a sleep mode), and various other factors. The rush current associated with the opening and closing of power gating switch 57 may in some cases be controlled by power monitoring unit 53. More particularly, power monitoring unit 53 may alter the rush current associated with the closing power gating switch 57 based on results obtained from monitoring supply voltage noise. For example, if it is determined that rush current associated with closing power gating switch 57 is causing an elevated level of supply voltage noise, power monitoring unit 53 may respond by altering the rush current in order to reduce the noise.

A voltage regulator 59 is also included in the embodiment of IC 50 shown in FIG. 5. Voltage regulator 59 may be configured to control the level of the supply voltage provided to core circuitry 55. For example, in one embodiment, voltage regulator 59 may be an adjustable voltage regulator that is configured to provide a range of voltages from Vdd to Vdd/2 to core circuitry 55. The voltage provided to core circuitry 55 by voltage regulator may be adjusted according to various factors, such as an operating mode. For example, if IC 50 is operating in a low power mode, voltage regulator 59 may be adjusted to provide a voltage of Vdd/2 to core circuitry 55, while a voltage of Vdd may be provided when operating in a high performance mode. Power monitoring unit 53 may also perform control actions with regard to voltage regulator 59 based on the monitoring of power supply noise. For example, if it is determined that the power supply noise is less at a certain operating voltage, e.g., at Vdd, power monitoring unit 53 may cause voltage regulator 59 to provide Vdd as the supply voltage to core circuitry 55.

It should also be noted that while the above functions of power monitoring unit 53 have been described in a hardware embodiment, software embodiments to perform these functions are also possible and contemplated. For example, operating system software could be designed to periodically query the count values of various instances of noise monitoring unit 10 on a given embodiment of IC 50, and could cause instructions to be executed based on these count values, wherein the execution of such instructions may cause various control actions to be performed.

Figure 6:
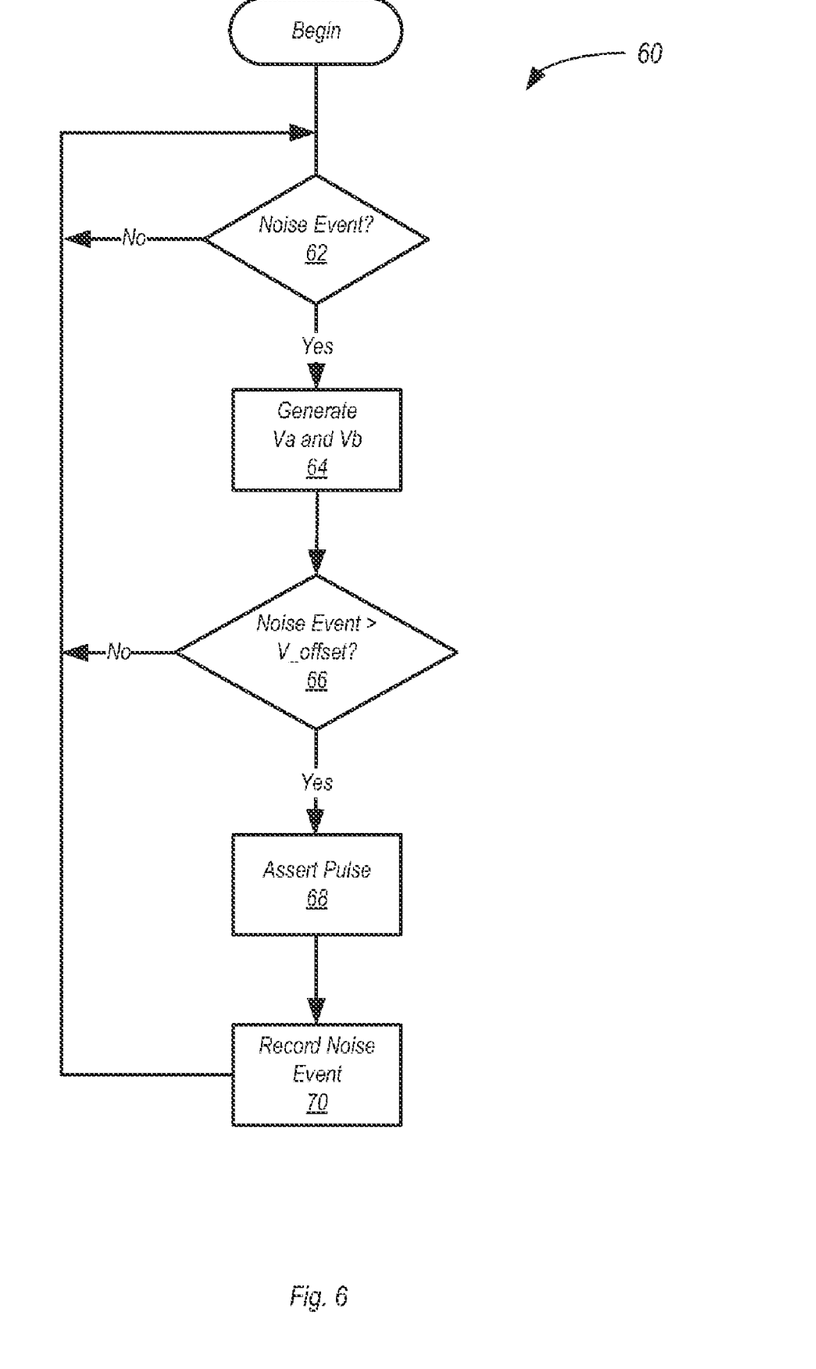
FIG. 6 is a flow diagram of one embodiment of a method for detecting supply voltage noise events.

Turning now to FIG. 6, a flow diagram of one embodiment of a method for detecting supply voltage noise events. In the embodiment shown, method 60 begins with monitoring for a supply voltage noise event (block 62). A noise event may occur (block 62, yes) when there is a fluctuation in the supply voltage (e.g., Vdd as discussed in any of the embodiments above) from a specified value. Such a noise fluctuation may be a spike, in which the supply voltage increases to a value above its specified value, or a droop, in which the supply voltage falls below its specified value. Monitoring may continue even if no noise event occurs (block 62, no).

Responsive to the noise event, first and second voltages (Va and Vb, respectively) may be generated (block 64). In one embodiment, voltages Va and Vb may be generated by level shifter circuits, as described above in conjunction with either of FIGS. 1 and 2. The circuitry used to generate voltages Va and Vb may be arranged such that these two voltages are different when the power supply voltage is stable. The difference between these two voltages may be referred to as the offset voltage, or V_offset as discussed above.

In the embodiment shown, for the noise event to be detected, it must cause a change in the relationship between Va and Vb, wherein the magnitude of the change exceeds V_offset. If the magnitude of this change does not exceed V_offset, the noise event may not be recorded (block 66, no). In some embodiments, detecting whether or not the magnitude of the change exceeds V_offset may be performed by comparing Va and Vb. For example, if Va is normally greater than Vb when the supply voltage is stable, a noise event may be detected when Va falls below Vb. In another example, if Vb is normally greater than Va when the supply voltage is stable, a noise event may be detected when Va rises above Vb.

When a noise event is detected wherein the magnitude of the difference between Va and Vb changes by more than the offset voltage value (block 66, yes), a pulse may be asserted (block 68). In one embodiment, the pulse may be asserted by a differential amplifier circuit coupled in a comparator configuration. The pulse asserted by the differential amplifier circuit may be positive going or negative going. The pulse may remain asserted as long as the magnitude of change exceeds the offset voltage (e.g., as long as Va is less than Vb in embodiments wherein Va>Vb when Vdd is stable).

Each noise event detected such that a pulse is asserted may be recorded (block 70). In one embodiment, the pulse may be input into a counter, which may cause the counter to increment a count value. In another embodiment, the pulse may set a bit in a bit vector. In general, any suitable mechanism for recording noise events may be utilized. The record of noise events may be stored for one or more later uses. For example, records of noise events may be used to create a supply voltage noise map for an IC, and/or may be used to control various aspects of circuitry that controls the power distribution to core circuitry of the IC.

Figure 7:
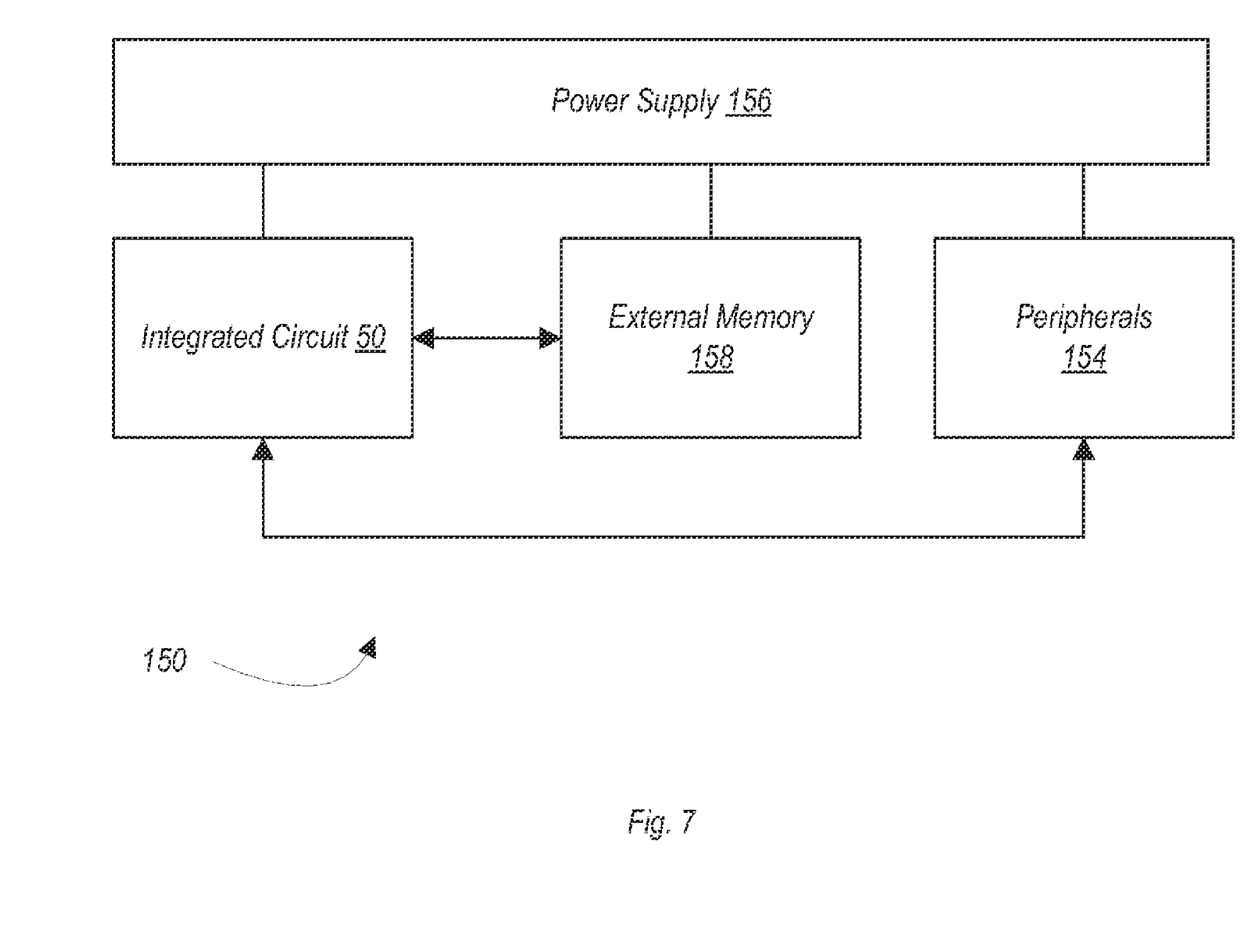
FIG. 7 is a block diagram of one embodiment of a system including the integrated circuit shown in FIG. 5.

Turning next to FIG. 7, a block diagram of one embodiment of a system 150 is shown. In the illustrated embodiment, the system 150 includes at least one instance of an IC 50 (from FIG. 5) coupled to one or more peripherals 154 and an external memory 158. The external memory 158 may include the memory 12. A power supply 156 is also provided which supplies the supply voltages to the IC 50 as well as one or more supply voltages to the memory 158 and/or the peripherals 154. In some embodiments, more than one instance of the IC 50 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
a voltage generation unit coupled to receive a power supply voltage, wherein the voltage generation unit is configured to generate first and second voltages responsive to the power supply voltage;
a detection unit coupled to receive the first and second voltages, wherein the detection unit is configured to detect power supply noise events based on values of the first and second voltages and to generate a count indicative of a number of power supply noise events; and
a power control unit coupled to receive the count from the detection unit and configured to change one or more parameters related to the power supply voltage responsive to receiving a count value exceeding a predetermined threshold value.

2. The apparatus as recited in claim 1, wherein the voltage generation unit includes first and second transistors each having respective gate terminals coupled to receive the power supply voltage, wherein the first transistor further includes a first terminal coupled to a first output node and wherein the second transistor further includes a second terminal coupled to a second output node, and wherein a width/length ratio of a channel of the first transistor is different from a width/length ratio of a channel of the second transistor.

3. The apparatus as recited in claim 2, wherein the voltage generation unit includes a filter capacitor coupled between the second output node and a ground node.

4. The apparatus as recited in claim 1, wherein the detection unit includes a differential amplifier coupled to receive the first voltage and the second voltage, wherein the differential amplifier is configured to generate pulses responsive to detected differences between the first voltage and the second voltage.

5. The apparatus as recited in claim 4, wherein the detection unit further includes a counter configured update the count responsive to the pulses generated by the differential amplifier.

6. A circuit comprising:
a first differential amplifier circuit, wherein the first differential amplifier circuit is coupled to receive a power supply voltage and is configured to generate first and second voltages responsive to a level of the power supply voltage;
a second differential amplifier circuit coupled to receive the first and second voltages, wherein the second differential amplifier circuit is configured to generate a pulse based on relative levels of the first voltage and the second voltage;
a pulse detection circuit configured to detect the pulse generated by the second differential amplifier, and further configured to generate a count indicative of a number of pulses received; and
a divider circuit coupled between the second differential amplifier and the pulse detection circuit, wherein the divider circuit is configured to cause the pulse detection circuit to increment M times for every N pulses, wherein M and N are integer values, and wherein N is greater than or equal to M.

7. The circuit as recited in claim 6, wherein the second differential amplifier is configured to generate the pulse responsive to the first voltage falling below the second voltage.

8. The circuit as recited in claim 6, wherein the second differential amplifier is configured to generate the pulse responsive to the first voltage becoming greater than the second voltage.

9. The circuit as recited in claim 6, wherein the first differential amplifier is configured to convey the first voltage on a first output and the second voltage on a second output, wherein the second output is coupled to a load circuit.

10. An integrated circuit comprising:
one or more noise monitoring units, wherein each of the one or more noise monitoring units includes:
a noise detection unit coupled to receive a power supply voltage and configured to vary at least one of a first and second output voltage based on the power supply voltage; and
an event detection unit coupled to receive the first and second output voltages, wherein the event detection unit is configured to detect a variation in the power supply voltage based on a variation of a relationship between the first and second output voltages, and further configured to generate a count value indicating a number of power supply variations detected; and
a power monitoring unit coupled to the event detection unit of each of the one or more noise monitoring units, wherein the power monitoring unit is configured to adjust one or more parameters related to the power supply voltage responsive to the counter value exceeding a predetermined counter threshold.

11. The integrated circuit as recited in claim 10, wherein the integrated circuit includes a plurality of noise monitoring units, and wherein the power monitoring unit is configured to generate a power noise map of the integrated circuit based on information received from the plurality of noise monitoring units.

12. The integrated circuit as recited in claim 10, wherein the integrated circuit includes at least one power gating switch and at least one core circuitry unit, wherein the power gating switch is configured to perform switching to alternately couple the power supply voltage to the core circuitry unit and decouple the power supply voltage from the core circuitry unit, and wherein power monitoring unit is configured to control a rate of said switching based on count values received from at least one of the one or more noise monitoring units.

13. The integrated circuit as recited in claim 10, wherein the noise detection unit of each of the one or more noise monitoring units includes:
a first differential amplifier coupled to the power supply voltage, wherein the first differential amplifier is configured to convey a first voltage on a first output and a second voltage on a second output; and
a filter coupled to the second output; and
wherein the event detection unit of each of the one or more noise monitoring units includes:
a second differential amplifier coupled to receive the first voltage on a first input and the second voltage on a second input, wherein the second differential amplifier is configured to generate a pulse responsive to a predetermined condition in a relationship between the first voltage and the second voltage; and
a counter configured to update the count value responsive to the second differential amplifier generating a predetermined number of pulses.

14. The integrated circuit as recited in claim 13, wherein the noise detection unit of each of the one or more noise monitoring units includes an enable input coupled to receive an enable signal, wherein the noise detection unit is configured to detect variation in the power supply voltage when the enable signal is active, and wherein the noise detection unit is further configured to ignore variations in the power supply voltage when the enable signal is inactive.

15. A method comprising:
generating a first voltage based on a power supply voltage;
generating a second voltage based on the power supply voltage;
responsive to a variations in the power supply voltage, generating corresponding pulses based on corresponding variations in a difference between the first voltage and the second voltage;
detecting the pulses;
providing a count value indicative of a number of a number of pulses detected; and
adjusting one or more parameters related to the power supply voltage responsive to the count value exceeding a predetermined threshold.

16. The method as recited in claim 15 further comprising generating a pulse when a level of the first voltage falls below a level of the second voltage.

17. The method as recited in claim 15 further comprising generating a pulse when a level of the first voltage become greater than a level of the second voltage.

18. The method as recited in claim 15 further comprising updating the count value responsive to receiving a predetermined number of pulses subsequent to a previous update of the count value.

19. The method as recited in claim 15 further comprising generating the first voltage and the second voltage to be at different levels when the power supply voltage is stable.

20. A noise detector comprising:
a first level shifter circuit coupled to receive a power supply voltage, wherein the first level shifter circuit is configured to provide a first voltage on a first output node based on the power supply voltage;
a second level shifter circuit coupled to receive the power supply voltage, wherein the second level shifter circuit is configured to provide a second voltage on a second output node based on the power supply voltage;
a filter coupled to the second output node;
a detector circuit coupled to receive the first voltage and the second voltage and configured to detect a noise event responsive to relative levels of the first and second voltages;
a counter configured to generate a count value based on a number of noise events detected by the detector circuit; and
a divider coupled between the detector circuit and the counter, wherein the divider is configured to cause the counter to increment M times for every N noise events detected by the detector, wherein M and N are integer values and wherein N is greater than or equal to M.

21. The noise detector as recited in claim 20, wherein the first level shifter circuit includes a first transistor having a gate terminal coupled to receive the power supply voltage, and a second transistor having a gate terminal coupled to receive the power supply voltage.

22. The noise detector as recited in claim 21, wherein the first transistor includes a first terminal coupled to a first output node and wherein the second transistor includes a second terminal coupled to a second output node, and wherein the second level shifter circuit includes a third transistor having a respective gate terminal coupled to the first output node and wherein the second level shifter includes a fourth transistor having a respective gate terminal coupled to the second output node, and wherein the third and fourth transistors include respective third and fourth terminals each coupled to a common node.

23. The noise detector as recited in claim 22, wherein the noise detector further includes a fifth transistor having a respective drain terminal coupled to the common node, a respective source terminal coupled to a ground node, and a respective gate terminal coupled to receive an enable signal.

24. The noise detector as recited in claim 21, wherein the first transistor has first channel width/length ratio and the second transistor has a second channel width/length ratio, wherein the first channel width/length ratio is different from the second channel width/length ratio.

\* \* \* \* \*